United States Patent [19]

Iida et al.

[11] 4,267,013

[45] May 12, 1981

[54] METHOD FOR DRY-ETCHING ALUMINUM AND ALUMINUM ALLOYS

[75] Inventors: Shinya Iida, Tama; Kazuyoshi Ueki, Ohme; Hideo Komatsu, Hinodemachi; Tatsumi Mitzutani, Kokubunji, all of Japan

[73] Assignee: Hitachi, Ltd., Tokyo, Japan

[21] Appl. No.: 45,744

[22] Filed: Jun. 5, 1979

[30] Foreign Application Priority Data

Jun. 5, 1978 [JP] Japan ................................. 53-66772

[51] Int. Cl.$^3$ ............................ C23F 1/00; C23F 1/02
[52] U.S. Cl. ................................... 156/643; 156/646; 156/656; 156/659.1; 156/665; 204/192 E; 252/79.1; 134/29; 134/30
[58] Field of Search ............... 252/79.1; 156/643, 646, 156/656, 659, 665, 659.1; 204/192 EC, 192 E, 164, 298; 134/1, 29, 30

[56] References Cited

U.S. PATENT DOCUMENTS

| | | | |
|---|---|---|---|
| 3,951,709 | 4/1976 | Jacob | 156/643 |
| 4,030,967 | 6/1977 | Ingrey et al. | 156/646 X |

OTHER PUBLICATIONS

Kodac Microelectronics Seminar Proceedings Interface 77, Plasma Etching of Aluminum by Herndon et al., pp. 33–41.

J. Vac. Sci. Technol., vol. 15, No. 2, Mar./Apr. 1978, Reactive Ion Etching of Aluminum and Aluminum Alloys in an Rf Plasma Containing Halogen Species by Schaible et al., pp. 334–337.

*Primary Examiner*—William A. Powell
*Attorney, Agent, or Firm*—Craig & Antonelli

[57] ABSTRACT

A method for dry-etching Al and Al alloys is disclosed, which comprises producing plasma discharges with a mixed gas comprising boron trichloride and freon and/or oxygen incorporated therein and patterning Al or an Al alloy by the produced discharges. In this dry etching method, the etch rate of Al or an Al alloy can be remarkably improved over the etch rate attainable according to the conventional techniques, and the difference of the etch rate between Al or an Al alloy and other material can be remarkably increased.

17 Claims, 3 Drawing Figures

METHOD FOR DRY-ETCHING ALUMINUM AND ALUMINUM ALLOYS

BACKGROUND OF THE INVENTION

The present invention relates to a method for patterning aluminum and aluminum alloy layers in the manufacture of semiconductor devices, magnetic devices, dielectric devices and the like. More particularly, the invention relates to a method for patterning aluminum and aluminum alloys according to dry-etching with a plasma discharge.

BRIEF DESCRIPTION OF THE PRIOR ART

Thin layers of aluminum, Al-Si alloys, Al-Cu alloys, Al-Cu-Si alloys and the like have heretofore been used for conductor wiring materials in large scale integrated circuits and metallizing materials of surface acoustic wave devices. In order to form such thin metal layers having a predetermined pattern on a substrate, there are ordinarily required the following steps: namely, the step of depositing a layer of Al or Al alloy, the step of coating a photoresist film on the Al or Al alloy layer, the step of drying the photoresist film, the step of exposing the photoresist film to light according to a predetermined pattern, the step of developing the exposed photoresist film and the step of dipping the substrate in an etching solution to remove the Al or Al alloy layer from the region not masked with the photoresist film. A liquid mixture comprising phosphoric acid, nitric acid, acetic acid and water is ordinarily used as an etching solution for Al or Al alloys. According to the method including dipping the entire substrate in such etching solution to remove an Al or Al alloy layer from a predetermined region, it is very difficult to form a fine pattern and an increase of the density or the degree of integration in the final devices is inhibited.

As a procedure for producing a thin metal layer having a finer pattern, there has recently been developed a dry-etching method involving the use of a reactive gas for etching Al or an Al alloy in a glow discharge zone. As a reactive gas as the atmosphere for dry-etching an Al or Al alloy layer, there have been used boron trichloride ($BCl_3$) or carbon tetrachloride ($CCl_4$) in this conventional dry-etching method. When carbon tetrachloride is used, the etch rate of aluminum is about 120 to about 150 nm/min. and is relatively high, and the difference of the etch rate between the photoresist material as the mask and the Al or Al alloy or between Si as the substrate of the Al or Al alloy layer and the Al or Al alloy, that is, the selectivity of the etch rate, is small. Assuming that the ratio of the etch rate of material A to the etch rate of material B is expressed as A/B, in case of carbon tetrachloride, the selectivity value of each of Al/photoresist material and Al/Si is about 1. As means for eliminating this defect of carbon tetrachloride, there is known a method in which a minute amount of He is incorporated in the Carbon tetrachloride to enhance the selectivity. Even in this method, the selectivity each of Al/photoresist material and Al/Si is about 2, and this method is still insufficient for practical operation. When boron trichloride is employed, the selectivity is improved over the case of carbon tetrachloride and in each of Al/photoresist material and Al/Si is about 3 and in Al/$SiO_2$ is about 10. However, in case of boron trichloride, the etch rate of Al is as low as about 60 nm/min., and the time required for etching an Al or Al alloy having a thickness of 1.0 to 1.5 $\mu$m, which is ordinarily used as a wiring material for a semiconductor device, is about 17 to about 25 minutes.

The following references are cited to show the state of the art: Japanese Patent Publication No. 7315/77; Japanese Patent Application Laid Open Specification No. 105272/76 and Japanese Patent Application Laid-Open Specification No. 36979/77.

SUMMARY OF THE INVENTION

It is a primary object of the present invention to provide a dry-etching method in which the foregoing defects involved in the conventional techniques can be overcome and Al and Al alloy layers can be etched at an excellent selectivity and an etch rate with high practical utility.

In accordance with the present invention, this object can be attained by a method for dry-etching Al and Al alloys which comprises producing plasma discharges with a gas comprising boron trichloride and at least one member selected from the group consisting of freon and oxygen and patterning Al or an Al alloy with ions or radicals generated by the plasma discharges.

Any of Al and Al alloys that have heretofore been used as metallizing materials of semiconductor devices or surface acoustic wave devices may be used in the dry-etching method of the present invention.

Any of freons such as $CF_4$, $C_2F_6$, $C_3F_8$, $CHF_3$ and $CCl_2F_2$ may be used as the freon in the present invention, but especially good results are obtained when $CF_4$ is used.

The amount of freon added to boron trichloride will now be described by reference to the use of $CF_4$ as an example. The amount added of freon is adjusted to not larger than 32% by volume based on the volume of boron trichloride (the amount added of freon or oxygen to boron trichloride will be expressed in terms of % by volume based on the volume of boron trichloride hereinafter), and is preferably adjusted to 10 to 28% by volume. Optimum results are obtained when the amount of freon added is about 20% by volume. When the amount of added freon is larger than 32% by volume, no substantial effect can be attained by the addition of freon and the etch rate to Al or Al alloy is drastically reduced. Accordingly, in this case, good results cannot be obtained. Even if the amount of freon added is very small, a certain effect can be attained correspondingly. In case of $C_2F_6$ or $C_4F_8$, the amount added is adjusted to not larger than about 14 or about 7% by volume, respectively.

The amount of oxygen added is adjusted to not larger than 6.5% by volume, preferably 2 to 5.5% by volume, and best results are obtained when oxygen is added in an amount of about 4% by volume. As in the case of freon, if the amount of oxygen added is larger than the upper limit, that is, 6.5% by volume, no substantial effect can be obtained by addition of oxygen and the etch rate to Al or Al alloy is drastically reduced, and no good results can be obtained. Even if the amount of oxygen added is very small, a certain effect can be attained correspondingly.

However, the lower limits of the amounts of the added freon and oxygen are both 0.5% by volume, practically, because of appreciable effect.

The amount of freon or oxygen added, described hereinbefore, is one adopted when freon or oxygen alone is added to boron trichloride. When both freon and oxygen are simultaneously added to boron trichloride, dry-etching can be performed with a further improved selectivity. The amounts of freon and oxygen added in case of this simultaneous addition may be the same as those described hereinbefore with respect to single addition. More specifically, the amounts added of freon and oxygen to boron trichloride are adjusted to be not larger than 32% by volume and not larger than 6.5% by volume, respectively. In this case, the amount of freon, for example, $CF_4$, is preferably 10 to 28% by volume and especially preferably about 20% by volume, and the amount of oxygen is preferably 2 to 5.5% by volume and is especially preferably about 4% by volume. If the amount of freon or oxygen added is larger than 32% by volume or 6.5% by volume, no substantial effect can be attained by addition of freon or oxygen.

The above-mentioned mixed gas is subjected to a plasma discharge treatment and Al or Al alloy is patterned by ions or radicals generated by this discharge treatment. This can be accomplished according to known plasma etching procedures using a known parallel diode type etcher utilizing plasma, which is customarily used in the art of semiconductors. Any etcher can be used so far as it performs etching by utilizing plasma discharge. A predetermined pattern can be formed on an Al or Al alloy layer according to this known plasma etching method. The dry-etching method of the present invention is characterized in that in forming a predetermined pattern on an al or al alloy layer according to this known plasma etching method, a mixed gas having the above-mentioned composition is used, whereby the etch rate and selectivity for the Al or Al alloy layer can be remarkably improved.

The gas pressure during dry-etching may be adjusted to a level customarily adopted, but in many cases, very good results are obtained if the gas pressure is further elevated by several Pa or more over the customary level. However, since an optimum gas pressure varies depending on the composition of the gas and the radio frequency power of a plasma etching device, it is preferred that an optimum gas pressure be experimentally determined according to actual conditions. When the frequency of the radio frequency power is 13.56 MHz and the electrode spacing in the etching device is 80 mm, the applicable gas pressure is in the range of from 1 to 150 Pa and the preferred gas pressure is 20 to 35 Pa.

The improvement of the etch rate and selectivity according to the present invention has been illustrated. If plasma discharge is carried out in a freon gas after completion of dry-etching, a very high effect of preventing corrosion of Al or Al alloy can be attained. In etching of Al or Al alloy using a chlorine type gas such as $CCl_4$ or $BCl_3$, because of the chlorine deposited on the surface of Al or the surface of the substrate, corrosion of Al or Al alloy, which should inherently be left, is often caused. In order to prevent this undesirable corrosion, sputtering in oxygen and water washing have heretofore been conducted, but no satisfactory effect has been obtained.

In the present invention, if supply of boron trichloride is stopped after completion of dry-etching while supplying freon alone and then, plasma cleaning in freon, dipping in a weakly alkaline aqueous solution and water washing are carried out, a sufficient effect of preventing corrosion of Al or Al alloy can be attained. As the weakly alkaline aqueous solution, there can be used, for example, aqueous ammonia and an aqueous solution of hydrazine. Good results are obtained if plasma cleaning is conducted in freon for about 1 minute.

After completion of the above-mentioned plasma cleaning, there may be adopted steps of conducting plasma cleaning in ammonia gas for 3 to 5 minutes and then conducting plasma cleaning in He or Ar gas for 2 to 5 minutes instead of the above-mentioned wet washing. In this case, an anti-corrosive effect comparable or superior to the anti-corrosive effect attainable according to the above procedures can be attained and the etching process can be accomplished entirely according to dry procedures. The above-mentioned plasma cleaning in ammonia gas may be omitted. However, a complete anti-corrosive effect can be attained when the plasma cleaning in ammonia gas is carried out.

The anti-corrosive treatment including the above-mentioned plasma cleaning in freon gas is effective also in dry-etching of aluminum or the like by using $CCl_4$ containing about 5% by volume of $CF_4$.

DETAILED DESCRIPTION OF THE PRESENTLY PREFERRED EMBODIMENTS

The present invention will now be described in detail by reference to the following Examples.

EXAMPLE 1

Boron trichloride ($BCl_3$) was fed at a flow rate of 50 ml/min. into a parallel diode etcher utilizing radio frequency plasma and carbon tetrafluoride ($CF_4$) was simultaneously fed at different flow rates, and the etch rates of Si, $SiO_2$, Al, an aluminum alloy containing 2% by weight of Si and 4% by weight of Cu, and a positive type photoresist (AZ-1350 or AZ-1350J manufactured and sold by Shipley Co., USA), each of which was placed on a radio frequency electrode, were measured. The positive type photoresist is a photoresist whose solubility in developer increases by light irradiation such as ultra violet rays or the like. The gas pressure was 21 Pa (0.16 Torr), the radio frequency power was 200 W, the frequency was 13.56 MHz and the electrode spacing was 80 mm.

In general, the applicable radio frequency power, frequency and electrode spacing are in the ranges of from 150 to 300 w, of from several hundred KHz to GHz region and of from 30 to 100 mm, respectively.

Figure 1:
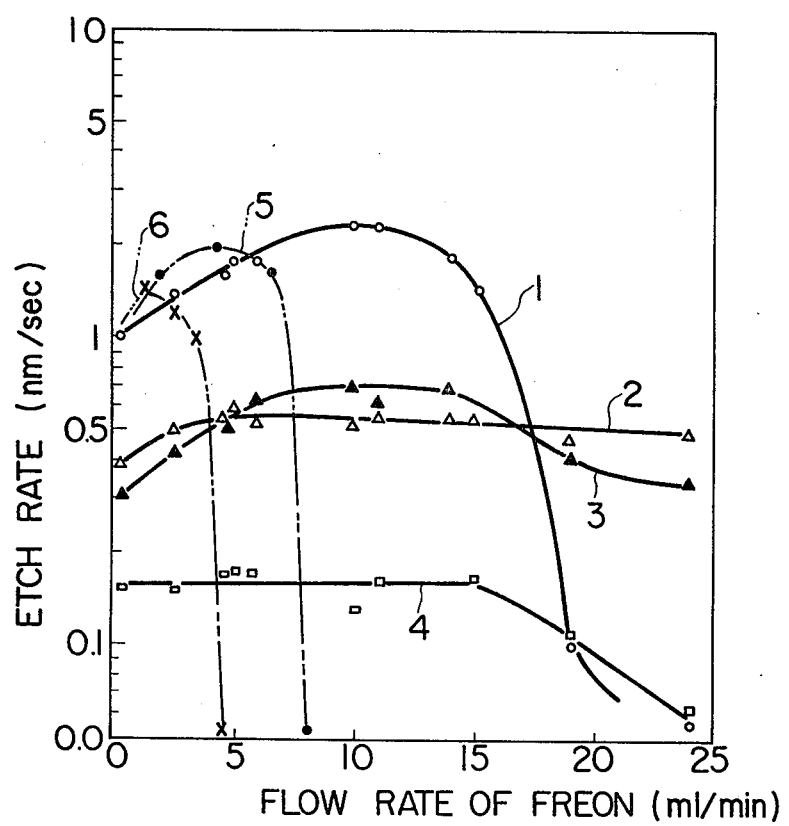
FIG. 1 is a graph illustrating the relation between the etch rate and the flow rate of $CF_4$ in dry etching using $BCl_3$ having $CF_4$ incorporated therein.

The measurement results are shown in FIG. 1. In FIG. 1 there are also shown results obtained when $C_2F_6$ or $C_4F_8$ was used as freon in case of etching of aluminum. In FIG. 1, the ordinate indicates the etch rate (nm/sec) and the abscissa indicates the flow rate (ml/min.) of freon. Curves 1, 2, 3 and 4 show results obtained in the cases of Al and the Al-Si-Cu alloy, Si, the photoresist and $SiO_2$, respectively, and in each case, $CF_4$ was used as freon. Curves 5 and 6 show results obtained in etching of Al using $C_2F_6$ and $C_4F_8$ as freon, respectively.

As will be apparent from the results shown in FIG. 1, the etch rates of Al and the Al-Si-Cu alloy attained by dry-etching in a mixed gas of BCl₃ fed at a flow rate of 50 ml/min. and CF₄ fed at a flow rate of 10 ml/min. (20% by volume) are about 3 times as high as the etch rates attained by dry-etching in BCl₃ alone. More specifically, etching of 1 μm thickness of Al or Al alloy is completed in 6 to 8 minutes in case of dry-etching in the mixed gas. Furthermore, the etch rates of SiO₂, the photoresist and Si are not substantially different between dry-etching in the mixed gas and dry-etching in BCl₃ alone. Accordingly, in dry-etching in the mixed gas, the selectivity is improved over the selectivity attainable in dry-etching in BCl₃ alone, and the selectivity of Al/SiO₂, Al/photoresist material or Al/Si is about 18, about 5 or about 6, respectively.

When the amount added of CF₄ is larger than 32% by volume (16 ml/min.), the etch rates of Al and Al alloy are drastically reduced and no substantial effect can be attained by addition of CF₄. Even if the amount added of freon is small, a certain effect can be attained correspondingly.

The case where CF₄ is used as freon (curve 1) is advantageous over the case where C₂F₆ (curve 5) or C₄F₈ (curve 6) is used as freon, because a maximum etch rate is higher and the change of the etch rate owing to variations of the flow rate of freon is remarkably reduced. Accordingly, it is judged that especially good results can be obtained when CF₄ is used as freon.

EXAMPLE 2

An aluminum alloy containing 2% by weight of Si and 4% by weight of Cu, which was placed on an Si wafer having a diameter of 76 mm, was dry-etched by plasma at a radio frequency power of 0.3 W/cm² in a mixed gas of boron trichloride (BDl₃) fed at a flow rate of 50 ml/min. and carbon tetrafluoride (CF₄) fed at a flow rate of 10 ml/min. by using a positive type photoresist (AZ-1350J) having a thickness of 0.9 μm as the mask. An ordinary diode plasma apparatus was used as the etching apparatus and the gas pressure was 20 Pa. The thickness of the Al alloy layer was 1 μm, and etching of the Al-Si-Cu alloy was completed in about 7 minutes. Immediately after completion of etching, supply of BCl₃ gas was stopped while supplying CF₄ gas alone, and plasma cleaning was carried out in plasma of CF₄ gas for 1 minute. The sample was taken out into air and dipped in weakly alkaline concentrated aqueous ammonia (10~30 vol.%) or aqueous solution of hydrazine (50~100 vol.%) for about 30 seconds. Then, water washing was carried out. The temperatures of the alkaline solution and water are room temperature. Corrosion was not observed in the so-treated Al-Si-Cu alloy layer of the sample.

In addition, stirring of the alkaline solution and/or water by an ultra sonic vibration can be conducted.

EXAMPLE 3

Boron trichloride (BCl₃) was fed at a flow rate of 50 ml/min. to a parallel diode etcher utilizing radio frequency plasma and oxygen (O₂) was simultaneously fed at a varying flow rate, and Si, SiO₂, Al, an Al alloy containing 2% by weight of Si and 4% by weight of Cu, and a positive type photoresist (AZ-1350J), each of which was placed on a radio frequency electrode, were etched and the etch rates were measured. The gas pressure was 20 Pa, the radio frequency power was 200 W, the frequency was 13.56 MHz and the electrode spacing was 80 mm.

Figure 2:
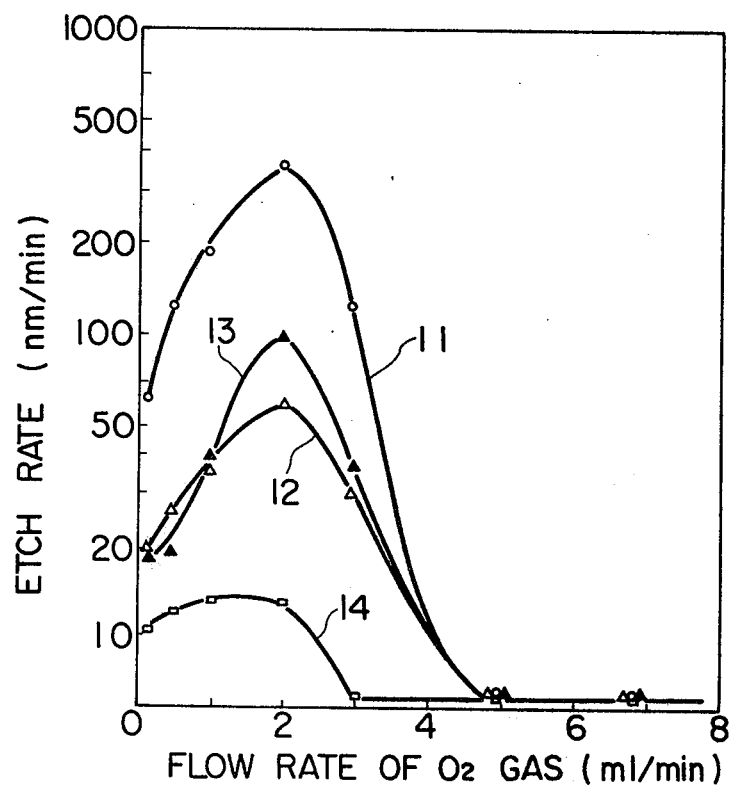
FIG. 2 is a graph illustrating the relation between the etch rate and the flow rate of $O_2$ in dry etching using $BCl_3$ having $O_2$ incorporated therein.

Measurement results are shown in FIG. 2. In FIG. 2, the ordinate indicates the etch rate (nm/min.) and the abscissa indicates the flow rate (ml/min.) of oxygen. Curves 11, 12, 13 and 14 show results obtained in the cases of Al and Al-Si-Cu alloy, Si, the photoresist material and SiO₂, respectively.

As will readily be understood from the results shown in FIG. 2, when dry-etching is carried out in a mixed gas of BCl₃ fed at a flow rate of 50 ml/min. and O₂ fed at a flow rate of 2 ml/min. (4% by volume), the etch rates of Al and Al-Si-Cu alloy attained are about 5 times as high as the etch rates attainable by dry etching in BCl₃ alone. More specifically, the etch rates of Al and Al alloy are 340 nm/min., and etching of Al and Al alloy in a thickness of 1 μm is completed in 3 to 5 minutes. Furthermore, the selectivity is improved in this case over the selectivity attained by dry etching in BCl₃ alone, and the selectivity of Al/SiO₂, Al/photoresist material or Al/Si is about 27, about 3.4 or about 5.7, respectively.

When the amount added of oxygen is larger than 6.5% by volume (about 3.3 ml/min.), the etch rates of Al and Al alloy are drastically reduced and no substantial effect can be attained by addition of oxygen. Even if the amount added of oxygen is very small, a certain effect can be attained correspondingly.

EXAMPLE 4

Si, SiO₂, Al, an aluminum alloy containing 2% by weight of Si and 4% by weight of Cu, and a positive type photoresist (AZ-1350J) were dry-etched in a mixed gas comprising boron trichloride (BCl₃) fed at a flow rate of 50 ml/min. and oxygen fed at a flow rate of 2 ml/min. (4% by volume) under varying gas pressure and radio frequency power, and the etch rates were measured. The frequency was 13.56 MHz and the electrode spacing was 80 mm.

When the radio frequency power was 200 W, each of the etch rates of Al, SiO₂ and the photoresist was 0 under a mixed gas pressure of 27 Pa (0.2 Torr). However, under a mixed gas pressure of 13 PA (0.1 Torr), the etch rate of Al and Al alloy is 200 nm/min., and the etch rate of the photoresist material, Si or SiO₂ is 53 nm/min., 12 nm/min. or 81 nm/min., respectively.

When the mixed gas pressure was controlled to 20 Pa (0.15 Torr), Al and Al alloy were not etched at a radio frequency power of 160 W, and at a radio frequency power of 250 W, the etch rates of Al and Al alloy were 400 nm/min. and the selectivity values of Al/SiO₂, Al/photoresist and Al/Si were 26, 4.8 and 2.1, respectively.

EXAMPLE 5

Boron trichloride (BCl₃) was fed at a flow rate of 50 ml/min. to a parallel diode etcher utilizing radio frequency plasma, and carbon tetrafluoride (CF₄) and oxygen (O₂) were simultaneously fed at flow rates of 8.5 ml/min. (17% by volume) and 2 ml/min. (4% by volume), respectively. Si, SiO₂, Al, an aluminum alloy containing 2% by weight of Si and 4% by weight of Cu, and a positive type photoresist (AZ-1350J) were dry-etched while selecting conditions of the radio frequency power and mixed gas pressure within ranges of from 150 to 250 W and from 20 to 33 Pa, respectively, so that plasma discharge was possible.

Figure 3:
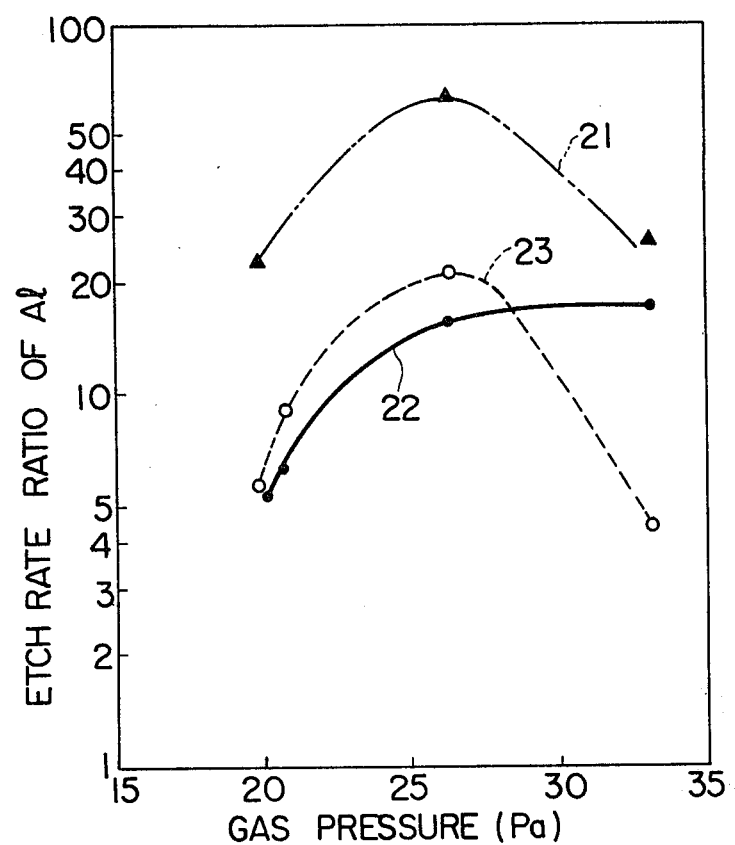
FIG. 3 is a graph illustrating the dependency of the etch rate ratio of aluminum on the gas pressure.

Results of measurement of selectivity characteristics are shown in FIG. 3. The ordinate indicates the etch rate ratio of Al and al alloy and the abscissa indicates the pressure (Pa) of the mixed gas. Curves 21, 22 and 23 show Al/SiO$_2$, Al/Si and Al/photoresist, respectively. When the gas pressure is 26.5 Pa, the etch rates of Al and Al alloy are about 140 nm/min., but as will readily be understood from FIG. 3, the selectivity is remarkably improved. Namely, the etch rate ratios of Al, that is, Al/SiO$_2$, Al/photoresist and Al/Si, are 65, 22 and 16, respectively.

When the pressure of the mixed gas is in the range of from 22 to 33 Pa (0.18 to 0.25 Torr), the range of the radio frequency power capable of causing plasma discharges should naturally be limited and the operation is considerably influenced by the etcher.

As will be apparent from the foregoing illustration, according to the present invention, by dry-etching an Al or Al alloy layer by using a mixed gas composed mainly of boron trichloride (BCl$_3$) and containing an appropriate amount of carbon tetrafluoride (CF$_4$) and/or oxygen (O$_2$), the problem of the selectivity involved in the conventional techniques can be remarkably improved and especially, Al/Si can be increased to about 16. Thus, a practically sufficient selectivity can be attained.

The foregoing illustration has been made mainly by reference to an embodiment where CF$_4$ is used as freon. The effect attained by addition of freon is due to incorporation of F into BCl$_3$. A certain effect can be attained by addition of C$_2$F$_6$ or C$_4$F$_8$, but this effect is lower than the effect attained by addition of CF$_4$ because the amount of F generated in plasma is relatively small. Attainment of a similar effect can be expected even if F$_2$ or HF is used instead of freon.

Furthermore, when plasma cleaning in CF$_4$ gas, washing with a weakly alkaline aqueous solution and water washing are carried out after dry-etching according to the present invention, complete prevention of corrosion of Al or Al alloy layers, which cannot be attained according to the conventional techniques, can be effectively attained.

What is claimed is:

1. A method for dry-etching aluminum and aluminum alloys which comprises producing plasma discharges with a gas comprising boron trichloride and at least one member selected from the group consisting of a halogenated hydrocarbon selected from the group consisting of CF$_4$, C$_2$F$_6$, C$_3$F$_8$, C$_4$F$_8$, CHF$_3$ and CCl$_2$F$_2$ and oxygen and patterning aluminum or an aluminum alloy with ions or radicals generated by said discharges.

2. A dry-etching method according to claim 1, wherein a mixed gas comprising boron trichloride and up to 32% by volume of said halogenated hydrocarbon incorporated therein is used.

3. A dry-etching method according to claim 1, wherein a mixed gas comprising boron trichloride and 10 to 28% by volume of said halogenated hydrocarbon incorporated therein is used.

4. A dry-etching method according to claim 1, wherein a mixed gas comprising boron trichloride and about 20% by volume of said halogenated hydrocarbon incorporated therein is used.

5. A dry-etching method according to claim 1, wherein a mixed gas comprising boron trichloride and up to 6.5% by volume of oxygen incorporated therein is used.

6. A dry-etching method according to claim 1, wherein a mixed gas comprising boron trichloride and 2 to 5.5% by volume of oxygen incorporated therein is used.

7. A dry-etching method according to claim 1, wherein a mixed gas comprising boron trichloride and about 4% by volume of oxygen incorporated therein is used.

8. A dry-etching method according to claim 1, wherein a mixed gas formed by incorporating up to 32% by volume of freon and up to 6.5% by volume of oxygen into boron trichloride is used.

9. A dry-etching method according to claim 8, wherein the amount of said halogenated hydrocarbon is 10 to 28% by volume.

10. A dry-etching method according to claim 8, wherein the amount of said halogenated hydrocarbon is about 20% by volume.

11. A dry-etching method according to claim 9, wherein the amount of oxygen is 2 to 5.5% by volume.

12. A dry-etching method according to claim 10, wherein the amount of oxygen is about 4% by volume.

13. A dry-etching method according to any of claims 1, 2, 3, 4, 8, 9, 10, 11 and 12 wherein the halogenated hydrocarbon is CF$_4$.

14. A method for dry-etching aluminum and aluminum alloys which comprises producing plasma discharges with a gas comprising boron trichloride and at least one member selected from the group consisting of a halogenated hydrocarbon selected from the group consisting of CF$_4$, C$_2$F$_6$, C$_3$F$_8$, C$_4$F$_8$, CHF$_3$ and CCl$_2$F$_2$ and oxygen, patterning aluminum or an aluminum aloy with ions or radicals generated by said discharges, and then, conducting plasma cleaning in said halogenated hydrocarbon, alkali washing and water washing.

15. A dry-etching method according to claim 14, wherein said member is the halogenated hydrocarbon.

16. A dry-etching method according to claim 15, wherein the halogenated hydrocarbon is CF$_4$.

17. A dry-etching method according to claim 14, wherein the member is oxygen.

* * * * *